United States Patent
Lee et al.

(10) Patent No.: US 9,676,063 B2
(45) Date of Patent: Jun. 13, 2017

(54) METHOD OF MANUFACTURING A METAL MASK BY LASER CUTTING

(71) Applicant: Samsung Display Co., Ltd., Yongin, Gyeonggi-Do (KR)

(72) Inventors: Doh-Hyoung Lee, Suwon-si (KR); Da Hee Jeong, Geumcheon-gu (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 289 days.

(21) Appl. No.: 14/320,835

(22) Filed: Jul. 1, 2014

(65) Prior Publication Data

US 2015/0104608 A1   Apr. 16, 2015

(30) Foreign Application Priority Data

Oct. 15, 2013 (KR) .................. 10-2013-0122828

(51) Int. Cl.

| | | |
|---|---|---|
| *B23K 26/38* | (2014.01) | |
| *C23C 14/04* | (2006.01) | |
| *B23K 26/382* | (2014.01) | |
| *B23K 26/362* | (2014.01) | |
| *H01L 51/56* | (2006.01) | |
| *H01L 51/00* | (2006.01) | |

(52) U.S. Cl.
CPC .......... *B23K 26/381* (2013.01); *B23K 26/362* (2013.01); *B23K 26/382* (2015.10); *C23C 14/042* (2013.01); *H01L 51/0011* (2013.01); *H01L 51/56* (2013.01); *Y10T 428/24273* (2015.01)

(58) Field of Classification Search
CPC .. B23K 26/362; B23K 26/381; B23K 26/382; B23K 26/384; B23K 26/364; B23K 26/50; B23K 26/57
See application file for complete search history.

(56) References Cited

U.S. PATENT DOCUMENTS 5,093,548 A * 3/1992 Schmidt-Hebbel B23K 26/0604
219/121.69
5,585,017 A 12/1996 James et al.
5,747,769 A * 5/1998 Rockstroh ............ B23K 26/364
219/121.69

(Continued)

FOREIGN PATENT DOCUMENTS

GB 2313079 A * 11/1997
JP 63-079948 A * 4/1988
(Continued)

*Primary Examiner* — Geoffrey S Evans
(74) *Attorney, Agent, or Firm* — Robert E. Bushnell, Esq.

(57) ABSTRACT

A manufacturing method of a metal mask including a plurality of pattern openings includes forming a first depression portion by radiating a first laser beam focused on a plane beyond a subject under processing, and then forming the plurality of pattern openings at a bottom part of the first depression portion by radiating a second laser beam focused on the bottom part of the first depression portion. Because the energy of the second laser beam is less than the first laser beam, manufacturing time of the mask is reduced while the sidewalls of the pattern opening are smooth and may be inclined, to allow for a better deposition of organic emission material onto a large display.

16 Claims, 5 Drawing Sheets

(56) References Cited

U.S. PATENT DOCUMENTS

| | | | |
|---|---|---|---|
| 6,787,734 B2 * | 9/2004 | Liu | B23K 26/02 219/121.7 |
| 8,222,562 B2 | 7/2012 | Bastawros et al. | |
| 8,568,963 B2 | 10/2013 | Lee et al. | |
| 2004/0038519 A1 * | 2/2004 | Yanagisawa | H01L 21/31138 438/637 |
| 2006/0261050 A1 * | 11/2006 | Krishnan | B23K 26/0617 219/121.74 |
| 2007/0193985 A1 | 8/2007 | Howard et al. | |
| 2011/0183271 A1 * | 7/2011 | Lee | B23K 26/38 83/13 |
| 2011/0244659 A1 * | 10/2011 | Wang | H01L 21/78 438/463 |
| 2013/0248503 A1 * | 9/2013 | Lee | B23K 31/02 219/121.72 |
| 2014/0291306 A1 * | 10/2014 | Lee | B23K 26/0093 219/121.72 |
| 2015/0068455 A1 * | 3/2015 | Lee | B23K 26/382 219/121.71 |
| 2015/0328662 A1 * | 11/2015 | Mizumura | B23K 26/08 425/174.4 |
| 2016/0114424 A1 * | 4/2016 | Hisada | B23K 26/0066 219/121.69 |

FOREIGN PATENT DOCUMENTS

| | | |
|---|---|---|
| JP | 2011-062650 A | 3/2011 |
| JP | 2013-108143 A | 6/2013 |
| KR | 10-2005-0091506 A | 9/2005 |
| KR | 10-0687486 B1 | 2/2007 |
| KR | 10-2007-0097181 A | 10/2007 |
| KR | 10-1097331 B1 | 12/2011 |
| KR | 10-1186747 B1 | 9/2012 |
| WO | WO-2011/148492 A1 * | 12/2011 |

* cited by examiner (a)  (b)

US 9,676,063 B2

METHOD OF MANUFACTURING A METAL MASK BY LASER CUTTING

CLAIM OF PRIORITY

This application claims priority to and the benefit of Korean Patent Application No. 10-2013-0122828 filed in the Korean Intellectual Property Office on Oct. 15, 2013, the entire contents of that are incorporated herein by reference.

BACKGROUND OF THE INVENTION

Field of the Invention

The present invention relates to a metal mask and a manufacturing method thereof for depositing an organic layer on a substrate.

Description of the Related Art

A display device is a device displaying an image, and recently, an organic light emitting diode (OLED) display has received attention. Unlike the liquid crystal display device, since the organic light emitting diode (OLED) display has a self-emitting characteristic and does not require an additional light source, it is possible to reduce thickness and weight thereof. In addition, the organic light emitting diode (OLED) display has high-quality characteristics such as low power consumption, high luminance, and fast response speed.

In general, the organic light emitting diode (OLED) display includes a first electrode, a second electrode, and an organic emission layer disposed between the first and second electrodes. Generally, when the organic emission layer is deposited on the first electrode of the substrate, the organic emission layer is formed on the first electrode through pattern openings in the metal mask.

The metal mask has been manufactured by wet etching or with a laser to form the pattern openings in a blank or subject under processing (SU). However, when the pattern openings are formed by wet etching in the subject under processing, an organic material passing through the pattern openings during deposition cannot have a wide deposition angle as a lateral side of the pattern opening is formed in a specific shape according to an etching rate intrinsic to the wet etching.

Particularly, in case where the display area of the organic light emitting diode (OLED) display is increased, a deposition abnormality occurs due to the problem described above, for the organic emission layer that is formed at edge portions of the substrate. Moreover, when the pattern openings are formed in the blank by a laser, there has been a problem that the total manufacturing time is increased due to the fact that the plurality of pattern openings are respectively formed in sequence, and that each opening is produced by the laser one at a time.

The above information disclosed in this Background section is only for enhancement of understanding of the background of the invention, and therefore it may contain information that does not constitute prior art as per 35 U.S.C. §102, taken either prior to or after the America Invents Act.

SUMMARY OF THE INVENTION

Exemplary embodiments of the present invention have been made in an effort to solve the problems described above, and provide a mask and a manufacturing method thereof that minimizes manufacturing time and provide an easier manufacturing process at the same time while forming a superior mask.

In the manufacturing method of the metal mask including a plurality of pattern openings, to achieve the technical objects describe above, one aspect of the present invention provides the manufacturing method of the metal mask including: forming a first depression portion by radiating a first laser beam focused on a lower region of a subject under processing to the subject under processing; and forming a plurality of pattern openings at a bottom part of the first depression portion by radiating a second laser beam focused on the bottom part of the first depression portion thereto.

According to one aspect of the present invention, there is provided a method of manufacturing a metal mask to include a plurality of pattern openings, including providing a metal blank for a subject under processing, forming a first depression portion in a front side of a first portion of the subject under processing by radiating a first laser beam onto the front side of the first portion of the subject under processing, a focal point of the first laser beam being on an opposite side of the subject under processing and forming the plurality of pattern openings at a bottom part of the first depression portion by radiating a second laser beam onto a front surface of the bottom part of the first depression portion. The first laser beam may have a higher energy than the second laser beam. The first laser beam may have a longer wavelength than the second laser beam. The first laser beam may have a wavelength of 800 nm to 1200 nm, and the second laser beam may have a wavelength of 400 nm to 600 nm. The first laser beam may have a longer pulse duration than the second laser beam. The first and second laser beams may be the same.

After the forming of the pattern openings, a plurality of ribs may be arranged between adjoining ones of the pattern openings, a thickness of each rib may be less than a thickness of the metal blank. An edge portion of the subject under processing may retain an original thickness equal to a thickness of the metal blank. After the forming of the pattern openings, a plurality of ribs may be arranged between adjoining ones of the pattern openings, a thickness of each rib may be less than a thickness of the edge portion of the subject under processing. Sidewalls of the first depression portion produced by the first laser beam may be rougher than sidewalls of the pattern openings produced by the second laser beam. Sidewalls of the pattern openings produced by the second laser beam may be inclined surfaces. A focal point of the second laser beam may be on a front surface of the bottom part of the first depression portion. The first depression portion may be absent of any pattern openings prior to the radiating of the second laser beam.

The method may also include forming a second depression portion communicated to the first depression portion by radiating the first laser beam onto a front side of a second portion of the subject under processing, wherein a focal point of the first laser beam being on an opposite side of the subject under processing, and forming a plurality of pattern openings at a bottom part of the second depression portion by focusing and radiating the second laser beam onto a front side of the bottom part of the second depression portion. The forming of the second depression portion may occur simultaneously with the forming of the pattern openings in the first depression portion.

According to another aspect of the present invention, there is provided a metal mask that includes a mask body, a depression portion arranged at a central region of the mask body, and a plurality of pattern openings arranged at a bottom part of the depression portion and being spaced-apart from each other by ribs. A first lateral side of the depression portion may have a higher surface roughness than a second lateral side of the pattern openings. The second lateral side may be inclined.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in that like reference symbols indicate the same or similar components, wherein.

DETAILED DESCRIPTION OF THE INVENTION

Figure 1:
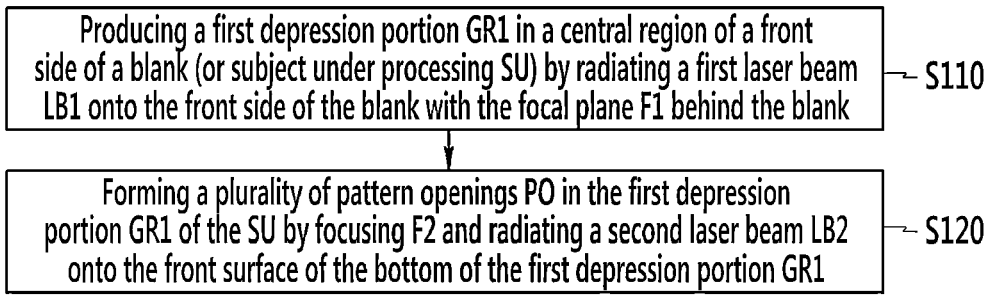
FIG. 1 is a flowchart showing a manufacturing method of a metal mask according to a first exemplary embodiment of the present invention.

The present invention will be described more fully hereinafter with reference to the accompanying drawings, in that exemplary embodiments of the invention are shown. As those skilled in the art would realize, the described embodiments may be modified in various different ways, all without departing from the spirit or scope of the present invention. The drawings and description are to be regarded as illustrative in nature and not restrictive. In addition, the size and thickness of each configuration shown in the drawings are arbitrarily shown for better understanding and ease of description, but the present invention is not limited thereto. In addition, unless explicitly described to the contrary, the word "comprise" and variations such as "comprises" or "comprising" will be understood to imply the inclusion of stated elements but not the exclusion of any other elements. Further, in the specification, the word "on" means positioning on or below the object portion, but does not necessarily mean positioning on the upper side of the object portion based on a gravity direction.

Hereinafter, a manufacturing method of a metal mask according to a first exemplary embodiment of the present invention will be described with reference to FIGS. 1 to 5. FIG. 1 is a flowchart showing a manufacturing method of a metal mask according to a first exemplary embodiment of the present invention and FIG. 2 to FIG. 5 are drawings to describe the manufacturing method of the metal mask according to the first exemplary embodiment of the present invention.

Figure 2:
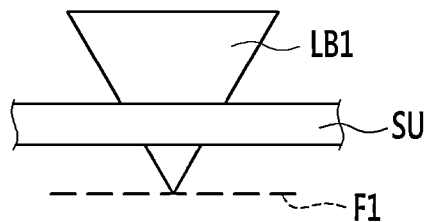
FIGS. 2 to 5 are drawings to describe the manufacturing method of the metal mask according to the first exemplary embodiment of the present invention.
Figure 3:
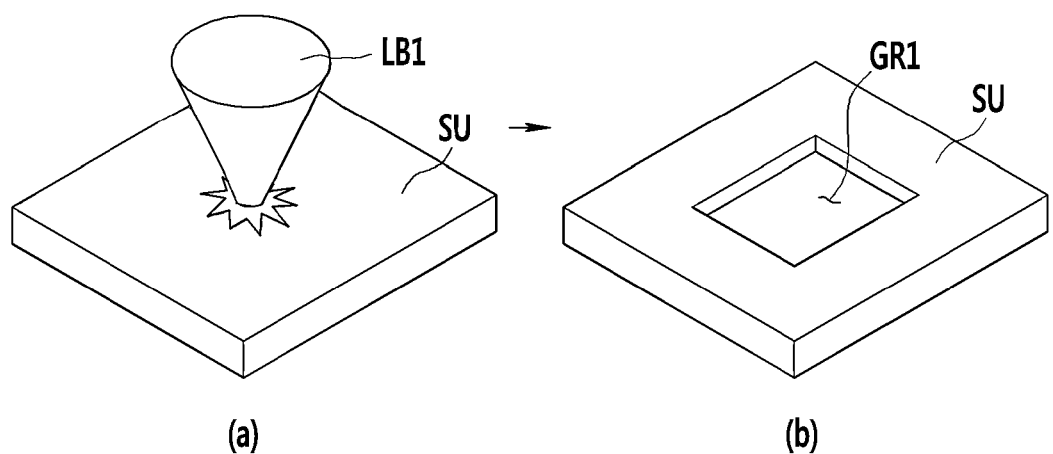

First, as shown in FIGS. 1 to 3, a laser beam LB1 is focused on a lower region of a blank, which is an unprocessed subject under processing SU, and radiates thereon to form a first depression portion GR1 (S110) in the SU. Specifically, as shown in FIGS. 2, 3a and 3b, the first laser beam LB1 is radiated onto a front surface of the SU but has a focal plane F1 or a focus point on an opposite side of the plate-shaped SU used to produce the metal mask. Focus adjustment of the first laser LB1 may be performed by an optical system including a lens and the like. As a result, a first depression portion GR1 is formed in a central region of the top surface of the SU.

In the present invention, the first laser beam LB1 may have higher energy than a second laser beam LB2 to be described later. Since the first laser beam LB1 has a higher energy than the second laser beam, the first depression portion GR1 may be formed in a shorter period of time compared with forming the pattern openings by the second laser beam LB2.

Furthermore, the first laser beam LB1 may have a longer wavelength than the second laser beam LB2. Specifically, the first laser beam LB1 may have a wavelength of 800 nm to 1200 nm. Since the first laser beam LB1 has a longer wavelength than the second laser beam LB2, the first depression portion GR1 may be formed in a shorter period of time compared with forming the pattern openings by the second laser beam LB2.

Furthermore, the first laser beam LB1 may have a longer pulse duration than the second laser beam LB2. Since the first laser beam LB1 has a longer pulse duration than the second laser beam LB2, the first depression portion GR1 may be formed in a shorter period of time compared with forming the pattern openings by the second laser beam LB2.

The second laser beam LB2 may be the same as the first laser beam LB1. Even if the second laser beam LB2 is the same as the first laser beam LB1, the first depression portion GR1 having a large area may be formed in a short period of time, because the first laser beam is focused on the first focal point F1 disposed at a region behind the subject under processing SU. Consequently, in the present invention, one or more of the 1) pulse length, 2) wavelength and 3) location of the focal plane of the first laser beam LB1 as compared to the second laser beam LB2 can be adjusted to achieve the desired results of having the first laser beam LB1 have a higher energy than that of the second laser beam LB2, so that the problems of 1) a prolonged processing time caused when only a single laser beam is used to produce the mask pattern from a blank, and 2) a low quality pattern unsuitable for producing large displays and having rough sidewalls can be overcome.

In FIG. 2, the first focal point F1 is focused on the region behind the subject under processing SU, but in another exemplary embodiment of the present invention, the first focal point F1 may be focused on a bottom part inside of the subject under processing SU.

Figure 4:
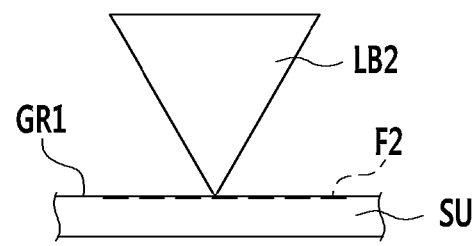
Figure 5:
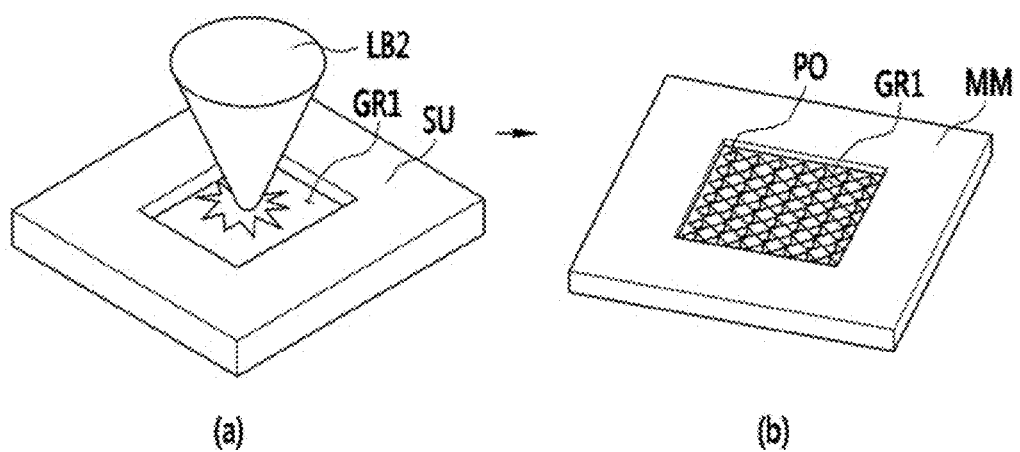

Next, as shown in FIGS. 4 and 5, a plurality of pattern openings PO are formed at the bottom part of the first depression portion GR1 by radiating and focusing the second laser beam LB2 thereon at the bottom part of the first depression portion GR1 (S120). Focus adjusting of the second laser beam LB2 may be performed by an optical system including a lens and the like. In detail, as shown in FIGS. 4a, 4b and 5, the second laser beam LB2 is focused on a second focal point F2 at a front surface of a bottom part of the first depression portion GR1 previously produced by the first laser beam LB1. The second laser beam LB2 is sequentially radiated several times onto the bottom part of the first depression portion GR1 to form the plurality of pattern openings PO thereat.

In the present invention, the second laser beam LB2 may have lower energy than the first laser beam LB1. When the second laser beam LB2 has lower energy than the first laser beam LB2, the lateral sides of the pattern opening PO created by the second laser beam LB2 may be smoother than a lateral sides of the first depression portion GR1 created by the first laser beam LB1. That is, the lateral sides of the first depression portion GR1 may have higher surface roughness than the lateral sides of the pattern opening PO.

The second laser beam LB2 may have a shorter wavelength than the first laser beam LB1. The second laser beam LB2 may have a wavelength of 400 nm to 600 nm. When the second laser beam LB2 has a shorter wavelength than the first laser beam LB1, the lateral sides of the pattern opening PO created by the second laser beam LB2 may have a smoother surface than the lateral sides of the first depression portion GR1 created by the first laser beam LB1.

The second laser beam LB2 may have a shorter pulse duration than the first laser beam LB1. When the second laser beam LB2 has a shorter pulse duration than the first laser beam LB1, the lateral sides of the pattern opening PO created by the second laser beam LB2 may have a smoother surface than the lateral sides of the first depression portion GR1 created by the first laser beam LB1.

The second laser beam LB2 may be the same as the first laser beam LB1. Even if the second laser beam LB2 is the same as the first laser beam LB1, the plurality of pattern openings PO may be formed in a shorter period of time, because the second laser beam LB2 is radiated onto a thinner piece of the SU that has already been thinned by the first laser beam LB1 in forming the first depression portion GR1.

Meanwhile, the second focal point F2 is focused on the surface of the first depression portion GR1 as illustrated in FIG. 4, but in another exemplary embodiment of the present invention, the second focal point F2 may be focused on the central region inside of the subject under processing SU. The metal mask MM including the plurality of pattern openings is manufactured by the process described above.

Accordingly, the manufacturing method of the metal mask according to the first exemplary embodiment of the present invention minimizes manufacturing time compared with the process of sequentially forming the pattern openings with a single laser beam, because forming the first depression portion GR1 by the first laser beam LB1 and then forming the plurality of pattern openings at the bottom part of the first depression portion GR1 by the second laser beam LB2 decreases the thickness of the subject under processing SU by the depth of the depression portion GR1 formed by the first laser beam LB1, and the bottom part of the depression portion GR1 thinned by the first laser beam LB1 is opened to form the plurality of pattern openings PO. This is achieved by varying one or more of 1) the pulse length, 2) the wavelength and 3) the location of the focal plane of the first laser beam LB1 as compared to the second laser beam LB2 so that the first laser beam LB1 may have a higher energy than that of the second laser beam LB2, so that the problems of 1) a prolonged processing time caused when only a single laser beam is used to produce the mask pattern from a blank, and 2) a low quality pattern being produced that has rough sidewalls and sidewall angles that are unsuitable for large-sized displays can be overcome.

The manufacturing method of the metal mask according to the first exemplary embodiment of the present invention is also advantageous by providing easier handling of the subject under processing SU, as the metal mask MM is made from the plate-shaped blank that is thicker than the thickness of the ribs between the pattern openings. Therefore, this is an improvement over a method and a metal mask where the thickness of the rib between neighboring pattern openings is equal to a thickness of the initial blank.

In more detail, in case the thickness of the initial blank is very thin, it is very difficult to handle the blank as it easily bends like a piece of paper. But the manufacturing method of the metal mask according to the first exemplary embodiment of the present invention is advantageous in terms of easier handling of the blank before forming the first depression portion GR1, as the subject under processing SU includes a depression portion GR1 having a reduced thickness corresponding to the thickness of the rib between the pattern openings. As a result, the handling of the SU benefits from the large thickness of the blank or the mask body while also benefiting by having only a very thin thickness that must be removed to form the pattern openings PO. Consequently, the manufacturing method of the metal mask having improved easiness in manufacturing is provided.

Moreover, in the manufacturing method of the metal mask MM according to the first exemplary embodiment of the present invention, the lateral side S2 of the pattern opening PO has a smooth surface as the second laser beam LB2 has lower energy or a shorter wavelength or shorter pulse duration than the first laser beam LB1. Because the lateral side S2 of the pattern opening PO has low surface roughness, the organic emission layer is more precisely formed on the substrate when depositing an organic emission layer through the metal mask MM. Accordingly, improved in manufacturing reliability of the display device is realized.

Hereinafter, a metal mask according to a second exemplary embodiment of the present invention will now be described with reference to FIGS. 6 and 7. The metal mask according to the second exemplary embodiment of the present invention may be manufactured by the manufacturing method according to the first exemplary embodiment of the present invention described above.

Figure 6:
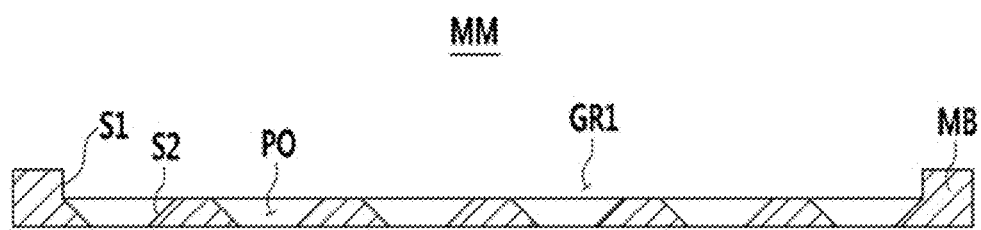
FIG. 6 is a cross-sectional view of a metal mask according to a second exemplary embodiment of the present invention.

FIG. 6 is a cross-sectional view of a metal mask according to the second exemplary embodiment of the present invention. As shown in FIG. 6, the metal mask MM according to the second exemplary embodiment of the present invention is used when forming an organic emission layer on the substrate, and includes a mask body MB, a first depression portion GR1, and pattern openings PO.

The mask body MB is formed in a plate shape, and has a thicker thickness than that of a rib disposed between the pattern openings. The first depression portion GR1 is disposed at a central region of the mask body MB, and is recessed to a predetermined depth. The first depression portion GR1 includes a first lateral side S1 forming the first depression portion GR1.

The pattern opening PO is provided in plural, and the plurality of pattern openings PO are disposed at a bottom part of the first depression portion GR1. The plurality of pattern openings PO are disposed apart from each other, and are interposed with ribs between neighboring pattern openings.

The pattern opening PO includes a second lateral side S2 forming the pattern opening PO. The second lateral side S2 has an inclined surface. Since the second lateral side S2 has an inclined surface, even though an organic material evaporated from a deposition source and thus penetrating the pattern opening PO has a wide deposition angle, the organic material may be easily deposited on the substrate through the pattern opening PO without being shadowed by the second lateral side S2 of the pattern opening PO. That is, even though a large display area of the organic light emitting diode (OLED) display is formed, the metal mask MM including the pattern opening PO easily passing the organic material evaporated from the deposition source onto the substrate is provided.

Figure 7:
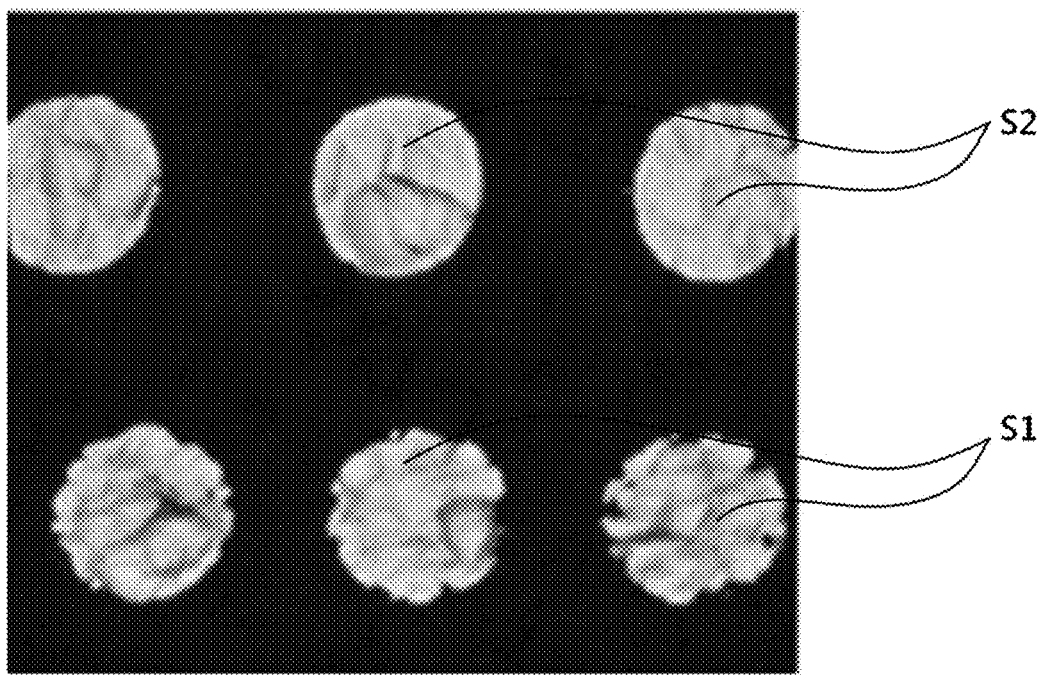
FIG. 7 is a picture showing respective surfaces of first and second lateral sides of the metal mask shown in FIG. 6.

FIG. 7 is a picture showing respective surfaces of first and second lateral sides S1 and S2 respectively of the metal mask shown in FIG. 6. As shown in FIG. 7, the first lateral side S1 of the first depression portion GR1 created by the first laser beam LB1 has a higher surface roughness than the second lateral side S2 of the pattern opening PO.

Accordingly, in the metal mask MM according to the second exemplary embodiment of the present invention, since the second lateral side S2 of the pattern opening PO has lower surface roughness than the first lateral side S1 of the first depression portion GR1, the organic emission layer is more precisely formed on the substrate when depositing the organic emission layer through the metal mask MM. The manufacturing method of the metal mask having improved manufacturing reliability is realized.

A manufacturing method of a metal mask MM according to a third exemplary embodiment will be described with reference to FIGS. 8 and 9. Hereinafter, portions of the third embodiment that differ from the first embodiment will be described and emphasized, while like portions will be omitted. Further, in the third exemplary embodiment of the present invention, the same constituent elements will be described by using the same reference numerals as in the first exemplary embodiment for convenience of the description.

Figure 8:
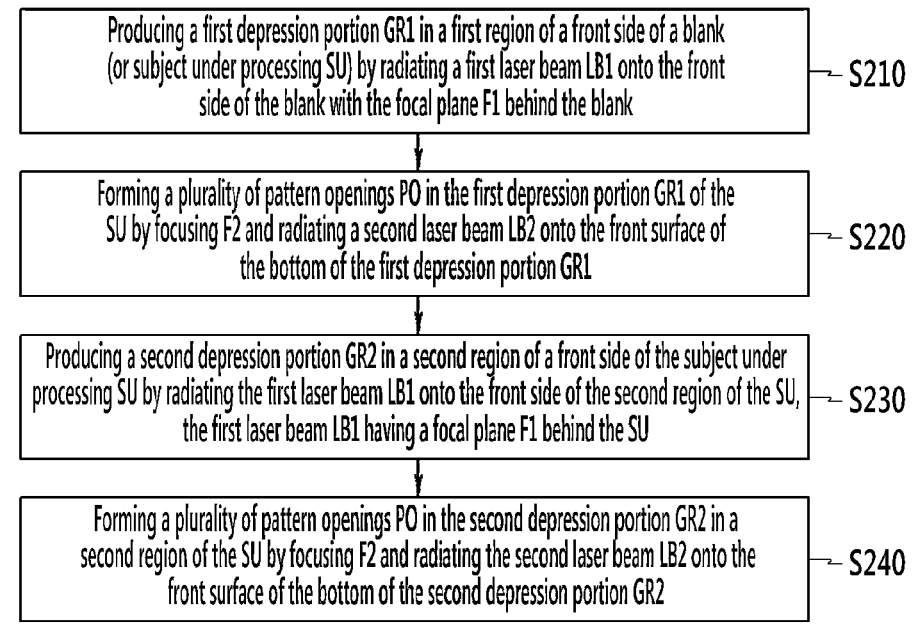
FIG. 8 is a flowchart showing a manufacturing method of a metal mask according to a third exemplary embodiment of the present invention.
Figure 9:
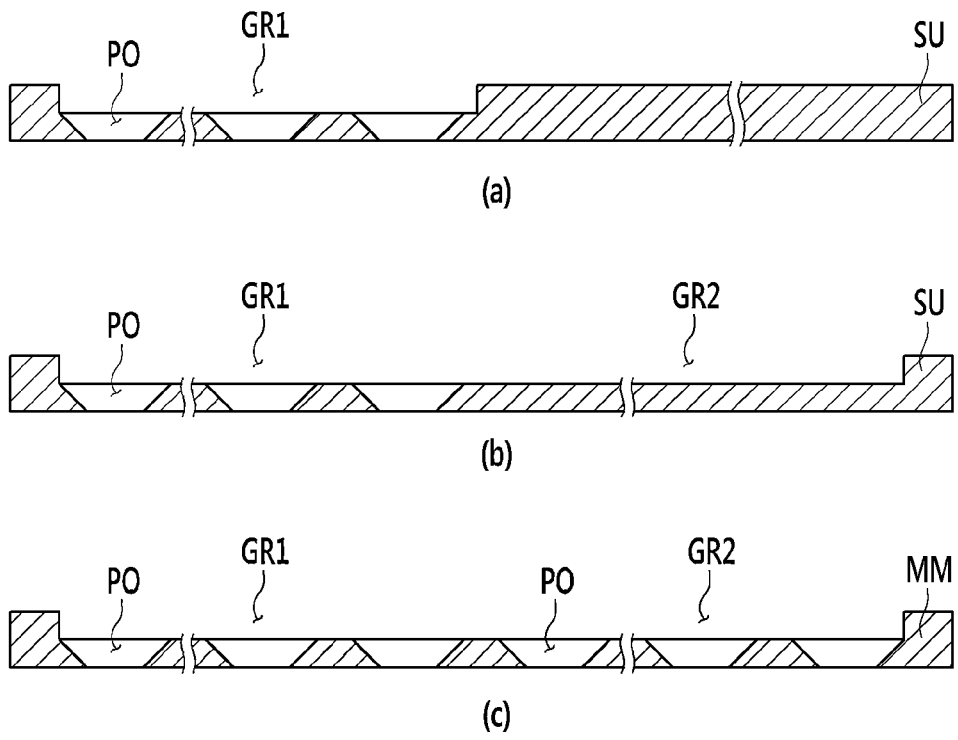
FIG. 9 is a drawing to describe a manufacturing method of the metal mask according to the third exemplary embodiment of the present invention.

Referring now to FIGS. 8, 9a and 9b, FIG. 8 is a flowchart showing a manufacturing method of a metal mask according to the third exemplary embodiment of the present invention and FIG. 9 is a drawing to describe a manufacturing method of the metal mask according to the third exemplary embodiment of the present invention.

First, as shown in FIG. 8 and FIG. 9a, a first laser beam LB1 focused on an opposite side of a blank or subject under processing SU is irradiated onto a first portion of the front side thereof to form a first depression portion GR1 (S210). Next, a second laser beam LB2 focused on a front surface of a bottom part of the first depression portion GR1 is irradiated thereto to form a plurality of pattern openings PO at the bottom part of the first depression portion GR1 (S220).

As shown in FIG. 9b, the first laser beam LB1 is then focused on a plane F1 on an opposite side of the SU and is irradiated onto a front side of a second portion of the subject under processing SU to form a second depression portion GR2 neighboring the first depression portion GR1 (S230). In more detail, the first laser beam LB1 having a focused at an opposite side of the subject under processing SU neighboring the first depression portion GR1 is irradiated on a second portion of the SU to form the second depression portion GR2 depressed from the original incident side of the SU to produce a second depression portion GR2 neighboring the first depression portion GR1.

Next, as shown in FIG. 9c, the second laser beam LB2 having a focal point F2 on a front side and on a bottom part of the second depression portion GR2 is irradiated thereto to form a plurality of pattern openings PO thereat (S240). In more detail, the second laser beam LB2 focused on a front surface of the bottom part of the second depression portion GR2 is sequentially radiated several times to form the plurality of pattern openings PO. As a result, the metal mask MM including the first depression portion GR1, the second depression portion GR2, and the plurality of pattern openings PO is manufactured by the process described above.

Accordingly, the manufacturing method of the metal mask MM according to the third exemplary embodiment of the present invention minimizes the manufacturing time compared with the process of sequentially forming the pattern openings with a single laser beam, because forming the first and second depression portions GR1 and GR2 by using the first laser beam LB1 and then forming the plurality of pattern openings at the respective bottom parts of the first and second depression portions GR1 and GR2 decreases the thickness of the subject under processing SU by the respective depths of the first and second depression portions GR1 and GR2, such that the respective bottom parts of the first and second depression portions GR1 and GR2 are opened to form the plurality of pattern openings PO.

The inventors of the present patent application have recognized the deficiencies of forming a pattern in metal mask used to deposit a patterned organic emission layer for a flat panel display, these deficiencies include 1) a long processing time, 2) rough sidewalls of the openings and 3) the sidewalls of the openings being unsuitable in the manufacture of large-sized OLED display devices due to the angle of the sidewalls. The inventors have overcome these problems by inventing a method of making and a metal mask whereby a two-step process occurs, the first step is to form a depression pattern in a metal blank by using a first laser beam LB1 of a high energy, and the second step is to form the openings that constitute pattern in the depression pattern by using a second laser beam LB2 to having a smaller energy than that of the first laser beam LB1. In addition to the above, second laser beam LB2 may have a shorter wavelength than that of the first laser beam LB1 to provide for an improved sidewall profile of the openings. The inventors have found that each of these goals can be achieved by varying one or more of 1) the wavelength, 2) the pulse width, and 3) the focal plane of the first laser beam LB1 as compared to that of the second laser beam LB2. Consequently, by using the above techniques, the inventors have found that a metal mask of a higher-quality can be produced in a shorter duration of time.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A manufacturing method a metal mask including a plurality of pattern openings, comprising:
    forming a first depression portion in a front side of a first portion of a subject under processing by radiating a first laser beam onto the front side of the first portion of the subject under processing, a focal point of the first laser beam being beyond an opposite side of the subject under processing; and
    forming the plurality of pattern openings at a bottom part of the first depression portion by radiating a second laser beam onto a front surface of the bottom part of the first depression portion.

2. The manufacturing method of claim 1, wherein the first laser beam has a higher energy than the second laser beam.

3. The manufacturing method of claim 1, wherein the first laser beam has a longer wavelength than the second laser beam.

4. The manufacturing method of claim 1, wherein the first laser beam has a wavelength of 800 nm to 1.200 nm, and the second laser beam has as wavelength of 400 nm to 000 nm.

5. The manufacturing method of claim 1, wherein the first laser beam has a longer pulse duration than the second laser beam.

6. The manufacturing method of claim 1, wherein the first and second laser beams are a same laser beam.

7. The manufacturing method of claim 1, further comprising:
providing a metal blank for the subject under processing.

8. The manufacturing method of claim 7, wherein after the forming of the pattern openings, a plurality of ribs are arranged between adjoining ones of the pattern openings, wherein a thickness of each rib is less than a thickness of the metal blank.

9. The manufacturing method of claim 7, wherein an edge portion of the subject under processing retains an original thickness equal to a thickness of the metal blank.

10. The manufacturing method of claim 9, wherein after the forming of the pattern openings, a plurality of ribs are arranged between adjoining ones of the pattern openings, wherein a thickness of each rib is less than a thickness of the edge portion of the subject under processing.

11. The manufacturing method of claim 1, wherein sidewalls of the first depression portion produced by the first laser beam is rougher than sidewalls of the pattern openings produced by the second laser beam.

12. The manufacturing method of claim 1, wherein sidewalls of the pattern openings produced by the second laser beam are inclined surfaces.

13. The manufacturing method of claim 1, wherein a focal point of the second laser beam is on the front surface of the bottom part of the first depression portion.

14. The manufacturing method of claim 1, wherein the first depression portion is absent of any pattern openings prior to the radiating of the second laser beam.

15. The manufacturing method of claim 1, further comprising:
forming a second depression portion communicating with the first depression portion by radiating the first laser beam onto a front side of a second portion of the subject wider processing; wherein a focal point of the first laser beam being on an opposite side of the subject under processing; and
forming a plurality of pattern openings at a bottom part of the second depression portion by focusing and radiating the second laser beam onto a front side of the bottom part of the second depression portion.

16. The manufacturing method of claim 15, wherein the forming of the second depression portion occurs simultaneously with the forming of the pattern openings in the first depression portion.

* * * * *